(12) United States Patent
Doczy et al.

(10) Patent No.: US 7,160,779 B2
(45) Date of Patent: Jan. 9, 2007

(54) METHOD FOR MAKING A SEMICONDUCTOR DEVICE HAVING A HIGH-K GATE DIELECTRIC

(75) Inventors: Mark L. Doczy, Beaverton, OR (US); Jack Kavalieros, Portland, OR (US); Justin K. Brask, Portland, OR (US); Matthew V. Metz, Hillsboro, OR (US); Suman Datta, Beaverton, OR (US); Brian S. Doyle, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/064,648

(22) Filed: Feb. 23, 2005

(65) Prior Publication Data

US 2006/0189156 A1    Aug. 24, 2006

(51) Int. Cl.
*H01L 21/336* (2006.01)

(52) U.S. Cl. .................. 438/283; 438/287; 438/216; 438/785; 257/E21.01

(58) Field of Classification Search ............... 438/287, 438/785, 216, 786, 787, 783, 788, 745, 591, 438/283
See application file for complete search history.

(56) References Cited

U.S. PATENT DOCUMENTS

| | | | | |
|---|---|---|---|---|
| 6,063,698 A | 5/2000 | Tseng et al. | ........... | 438/585 |
| 6,184,072 B1* | 2/2001 | Kaushik et al. | ........... | 438/197 |
| 6,255,698 B1 | 7/2001 | Gardner et al. | ........... | 257/369 |
| 6,365,450 B1 | 4/2002 | Kim | ........... | 438/216 |
| 6,410,376 B1 | 6/2002 | Ng et al. | ........... | 438/199 |
| 6,420,279 B1 | 7/2002 | Ono et al. | ........... | 438/785 |
| 6,475,874 B1 | 11/2002 | Xiang et al. | ........... | 438/396 |
| 6,511,925 B1* | 1/2003 | Aronowitz et al. | ........... | 438/788 |
| 6,514,828 B1 | 2/2003 | Ahn et al. | ........... | 438/240 |
| 6,544,906 B1 | 4/2003 | Rotondaro et al. | ........... | 438/785 |
| 6,586,288 B1 | 7/2003 | Kim et al. | ........... | 438/183 |
| 6,602,753 B1* | 8/2003 | Koyama et al. | ........... | 438/287 |
| 6,617,209 B1 | 9/2003 | Chau et al. | ........... | 438/240 |
| 6,617,210 B1 | 9/2003 | Chau et al. | ........... | 438/240 |
| 6,620,713 B1 | 9/2003 | Arghavani et al. | ........... | 438/585 |
| 6,642,131 B1 | 11/2003 | Harada | ........... | 438/591 |
| 6,667,246 B1 | 12/2003 | Mitsuhashi et al. | ........... | 438/756 |
| 6,689,675 B1 | 2/2004 | Parker et al. | ........... | 438/585 |
| 6,696,327 B1 | 2/2004 | Brask et al. | ........... | 438/197 |
| 6,696,345 B1 | 2/2004 | Chau et al. | ........... | 438/387 |
| 6,703,277 B1* | 3/2004 | Paton et al. | ........... | 438/287 |
| 6,709,911 B1 | 3/2004 | Doczy et al. | ........... | 438/197 |
| 6,713,358 B1 | 3/2004 | Chau et al. | ........... | 438/287 |

(Continued)

FOREIGN PATENT DOCUMENTS

EP    0 899 784 A2    3/1999

(Continued)

OTHER PUBLICATIONS

Polishchuk et al., "Dual Workfunction CMOS Gate Technology Based on Metal Interdiffusion", www.eesc.berkeley.edu, 1 page.

(Continued)

*Primary Examiner*—Asok K. Sarkar
*Assistant Examiner*—Victor V. Yevsikov
(74) *Attorney, Agent, or Firm*—Michael D. Plimier

(57) ABSTRACT

A method for making a semiconductor device is described. That method comprises forming a high-k gate dielectric layer that contacts a metal oxide layer. The metal oxide layer is generated by forming a metal layer, then oxidizing the metal layer.

9 Claims, 1 Drawing Sheet

U.S. PATENT DOCUMENTS

| | | | |
|---|---|---|---|
| 6,716,707 B1 | 4/2004 | Brask et al. | 438/287 |
| 6,727,130 B1 | 4/2004 | Kim et al. | 438/199 |
| 6,746,967 B1 | 6/2004 | Brask et al. | 438/752 |
| 6,770,568 B1 | 8/2004 | Brask et al. | 438/746 |
| 6,787,440 B1 | 9/2004 | Lindert et al. | 438/591 |
| 6,794,234 B1 | 9/2004 | Polishchuk et al. | 438/199 |
| 6,806,146 B1 | 10/2004 | Brask et al. | 438/287 |
| 6,855,639 B1 | 2/2005 | Brask et al. | 438/742 |
| 2002/0058374 A1 | 5/2002 | Kim et al. | 438/228 |
| 2002/0086504 A1 | 7/2002 | Park et al. | 438/580 |
| 2002/0197790 A1 | 12/2002 | Kizilyalli et al. | 438/240 |
| 2003/0032303 A1 | 2/2003 | Yu et al. | 438/770 |
| 2003/0045080 A1 | 3/2003 | Visokay et al. | 438/591 |
| 2003/0113972 A1* | 6/2003 | Hayashi et al. | 438/287 |
| 2005/0181619 A1* | 8/2005 | Hwu et al. | 438/745 |
| 2005/0212065 A1* | 9/2005 | Forbes | 257/411 |
| 2005/0282341 A1* | 12/2005 | Park et al. | 438/283 |

FOREIGN PATENT DOCUMENTS

GB    2 358 737 A    4/2001

OTHER PUBLICATIONS

Doug Barlage et al., "High-Frequency Response of 100nm Integrated CMOS Transistors with High-K Gate Dielectrics", 2001 IEEE, 4 pages.

Lu et al., "Dual-Metal Gate Technology for Deep-Submicron CMOS Devices", dated Apr. 29, 2003, 1 page.

Schwantes et al., "Performance Improvement of Metal Gate CMOS Technologies with Gigabit Feature Sizes", Technical University of Hanburg-Harburg, 5 pages.

* cited by examiner

METHOD FOR MAKING A SEMICONDUCTOR DEVICE HAVING A HIGH-K GATE DIELECTRIC

FIELD OF THE INVENTION

The present invention relates to methods for making semiconductor devices, in particular, those that include high-k gate dielectric layers.

BACKGROUND OF THE INVENTION

MOS field-effect transistors with very thin silicon dioxide based gate dielectrics may experience unacceptable gate leakage currents. Forming the gate dielectric from certain high-k dielectric materials, instead of silicon dioxide, can reduce gate leakage. When conventional processes are used to deposit a high-k gate dielectric on a silicon substrate, a silicon dioxide transition layer may form between the dielectric and the substrate. The presence of that transition layer may contribute to the overall electrical thickness of the gate dielectric stack. As devices continue to shrink, it may be desirable to decrease the electrical thickness by eliminating that transition layer.

Accordingly, there is a need for an improved process for making a semiconductor device that includes a high-k gate dielectric. There is a need for a process for forming such a device that eliminates the silicon dioxide transition layer, which forms when a high-k gate dielectric is deposited on an underlying silicon substrate. The method of the present invention provides such a process.

Features shown in these figures are not intended to be drawn to scale.

DETAILED DESCRIPTION OF THE PRESENT INVENTION

A method for making a semiconductor device is described. That method comprises forming a high-k gate dielectric layer that contacts a metal oxide layer, wherein the metal oxide layer is generated by forming a metal layer, then oxidizing the metal layer. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1A:
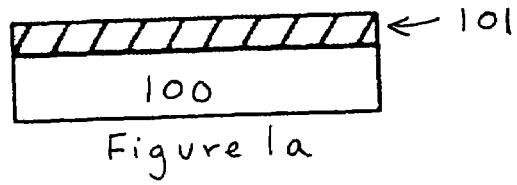
FIGS. 1a–1b represent cross-sections of structures that may be formed when carrying out an embodiment of the method of the present invention.
Figure 1B:
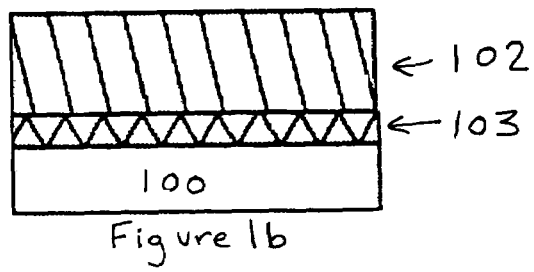

FIGS. 1a–1b represent cross-sections of structures that may be formed when carrying out an embodiment of the method of the present invention. FIG. 1a represents substrate 100 upon which is formed metal layer 101. Substrate 100 may comprise any material that may serve as a foundation upon which a semiconductor device may be built. In this embodiment, substrate 100 is a silicon containing substrate.

Metal layer 101 comprises a metal that may be oxidized to form a metal oxide layer. Metal layer 101 may, for example, comprise titanium, zirconium, hafnium, tantalum, niobium, and/or yttrium. Metal layer 101 may be formed on silicon containing substrate 100 using conventional deposition processes, e.g., sputter, evaporation, molecular beam, and chemical vapor deposition (such as atomic layer chemical vapor deposition) techniques. Metal layer 101 preferably is between about 5 angstroms and about 10 angstroms thick. Although a few examples of metals that may be used to form metal layer 101 are described here, that layer may be made from other metals that may serve to getter oxygen, which otherwise could react with the underlying silicon containing substrate to generate an undesirable silicon dioxide transition layer.

After forming metal layer 101 on silicon containing substrate 100, high-k gate dielectric layer 102 is formed on metal layer 101. High-k gate dielectric layer 102 may comprise, for example, hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, lanthanum oxide, zirconium oxide, and aluminum oxide. Although a few examples of materials that may be used to form dielectric layer 102 are described here, that layer may be made from other materials that serve to reduce gate leakage.

In the method of the present invention, high-k gate dielectric layer 102 is formed on metal layer 101 via an atomic layer chemical vapor deposition ("ALCVD") process. In a conventional ALCVD process, a growth cycle is repeated until a high-k gate dielectric layer of a desired thickness is created. Typically, such a growth cycle comprises the following sequence. Steam is introduced into a CVD reactor for a selected pulse time, followed by a purging gas. A conventional precursor (e.g., a metal chloride or other metal halide) is then pulsed into the reactor, followed by a second purge pulse. (A carrier gas that comprises nitrogen or another inert gas may be injected into the reactor at the same time.)

While operating the reactor at a selected pressure and maintaining the substrate at a selected temperature, steam, the purging gas, and the precursor are, in turn, fed at selected flow rates into the reactor. By repeating this growth cycle—steam, purging gas, precursor, and purging gas—multiple times, one may create a high-k gate dielectric layer of a desired thickness on metal layer 101. The pressure at which the reactor is operated, the gases' flow rates, and the temperature at which the substrate is maintained may be varied depending upon the application and the precursor that is used. The CVD reactor should be operated long enough to form a layer with the desired thickness. In most applications, high-k gate dielectric layer 102 should be less than about 40 angstroms thick, and more preferably between about 5 angstroms and about 20 angstroms thick.

As illustrated in FIG. 1b, metal layer 101 is oxidized to form metal oxide layer 103 as high-k gate dielectric layer 102 is formed on metal layer 101. Metal oxide layer 103 becomes part of a high-k gate dielectric stack that includes metal oxide layer 103 and high-k gate dielectric layer 102. Because metal layer 101 getters oxygen, which is generated when high-k gate dielectric layer 102 is deposited, it may prevent a silicon dioxide layer from forming between high-k gate dielectric layer 102 and silicon containing substrate 100. The composition of metal oxide layer 103 will depend upon the metal used for metal layer 101. For example, if metal layer 101 comprises titanium, zirconium, hafnium, or tantalum, then metal oxide layer 103 will comprise titanium oxide, zirconium oxide, hafnium oxide, or tantalum oxide.

Metal oxide layer 103 effectively serves as a substitute for the silicon dioxide layer that otherwise would have formed between high-k gate dielectric layer 102 and silicon containing substrate 100. A dielectric stack that includes metal oxide layer 103 may have about the same physical thickness as a dielectric stack that includes a silicon dioxide layer. The electrical thickness of such a metal oxide layer will, however, be lower than the electrical thickness of a silicon dioxide layer. As a result, this embodiment of the method of the present invention enables a high-k gate dielectric stack with a physical thickness like the physical thickness of a silicon dioxide containing stack, but with a reduced electrical thickness. Reducing electrical thickness, while maintaining essentially the same physical thickness, may enable a higher performance transistor without the concomitant increase in gate leakage, which would be expected to accompany decreased physical thickness.

After forming high-k gate dielectric layer 102 and metal oxide layer 103, a metal gate electrode (not shown) may be formed on the high-k gate dielectric stack, as will be apparent to those skilled in the art. The metal gate electrode may comprise any conductive material from which metal gate electrodes may be derived, and may comprise an NMOS or PMOS metal gate electrode. Materials that may be used to form n-type metal gate electrodes include: hafnium, zirconium, titanium, tantalum, aluminum, their alloys (e.g., metal carbides that include these elements, i.e., hafnium carbide, zirconium carbide, titanium carbide, tantalum carbide, and aluminum carbide), and aluminides (e.g., an aluminide that comprises hafnium, zirconium, titanium, tantalum, or tungsten). Materials for forming p-type metal gate electrodes include: ruthenium, palladium, platinum, cobalt, nickel, and conductive metal oxides, e.g., ruthenium oxide.

Metal NMOS gate electrodes preferably have a workfunction that is between about 3.9 eV and about 4.2 eV. Metal PMOS gate electrodes preferably have a workfunction that is between about 4.9 eV and about 5.2 eV. A metal gate electrode that is formed on high-k gate dielectric layer 102 may consist essentially of a homogeneous metal layer. Alternatively, relatively thin n-type or p-type metal layers (like those listed above) may generate the lower part of the metal gate electrode, with the remainder of the metal gate electrode comprising another metal or metals, e.g., a metal that may be easily polished like tungsten, aluminum, titanium, or titanium nitride. Although a few examples of materials for forming a metal gate electrode are identified here, such a component may be made from many other materials, as will be apparent to those skilled in the art. Moreover, although a metal gate electrode preferably is formed on high-k gate dielectric layer 102, a gate electrode that comprises polysilicon or a silicide may alternatively be formed on that dielectric layer.

Figure 2A:
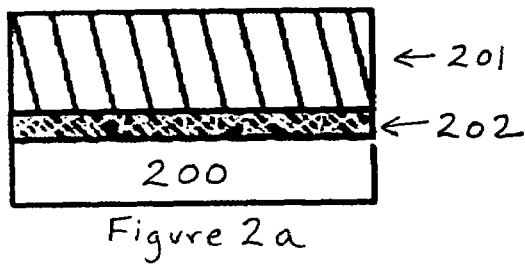
FIGS. 2a–2c represent cross-sections of structures that may be formed when carrying out a second embodiment of the method of the present invention.
Figure 2B:
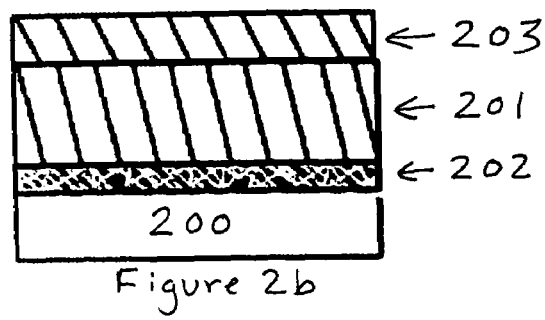
Figure 2C:
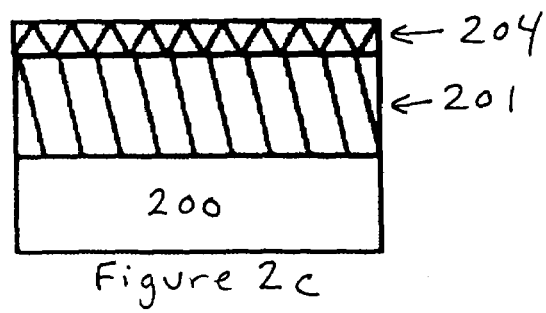

FIGS. 2a–2c represent cross-sections of structures that may be formed when carrying out a second embodiment of the method of the present invention. In this second embodiment, high-k gate dielectric layer 201 is formed on silicon containing substrate 200. High-k gate dielectric layer 201 may comprise any of the previously identified materials, and may be formed on silicon containing substrate 200 using an ALCVD process that employs a conventional metal halide precursor, as indicated above. As FIG. 2a illustrates, silicon dioxide transition layer 202 forms between high-k gate dielectric layer 201 and silicon containing substrate 200, when high-k gate dielectric layer 201 is formed on silicon containing substrate 200 using such a conventional ALCVD process. Silicon dioxide transition layer 202 may be between about 5 angstroms and about 10 angstroms thick.

After forming high-k gate dielectric layer 201, metal layer 203 is formed on high-k gate dielectric layer 201, generating the FIG. 2b structure. Metal layer 203 comprises a metal that may be oxidized to form a metal oxide layer. Metal layer 203 may comprise a metal that, when oxidized, may form a nonconductive metal oxide layer that may combine with high-k gate dielectric layer 201 to create a high-k gate dielectric stack. Examples of such metals were presented above, e.g., titanium, zirconium, hafnium, tantalum, niobium, and yttrium.

Alternatively, metal layer 203 may comprise a metal that, when oxidized, may form a conductive metal oxide. Examples of such metals include ruthenium and iridium—although those skilled in the art will recognize that other metals exist, which may be oxidized to form conductive metal oxides. Whereas, nonconductive metal oxides may become part of the high-k gate dielectric stack, such conductive metal oxides (e.g., ruthenium oxide and iridium oxide) may become part of a metal gate electrode stack that may be formed on high-k gate dielectric layer 201.

Irrespective of whether metal layer 203 may be oxidized to form a nonconductive or conductive metal oxide, that layer may be deposited on high-k gate dielectric layer 201 using conventional deposition processes, e.g., sputter, evaporation, molecular beam, ALCVD or other CVD techniques. Metal layer 203 preferably is between about 5 angstroms and about 10 angstroms thick. Although a few examples of metals that may be used to form metal layer 203 are described here, that layer may be made from other metals that may extract oxygen from silicon dioxide transition layer 202, when subject to an appropriate anneal process, to reduce that transition layer back into silicon.

After metal layer 203 is formed on high-k gate dielectric layer 201, the resulting structure is annealed at an appropriate temperature for an appropriate time to enable metal layer 203 to getter oxygen from silicon dioxide transition layer 202. As FIG. 2c illustrates, that process converts metal layer 203 into metal oxide layer 204, while simultaneously reducing silicon dioxide transition layer 202 back into silicon.

A metal gate electrode (not shown) may then be formed on metal oxide layer 204. As mentioned above, if metal oxide layer 204 is nonconductive, then it may comprise part of a high-k gate dielectric stack, which includes high-k gate dielectric layer 201. If metal oxide layer 204 is conductive, it may instead comprise part of the metal gate electrode. Replacing silicon dioxide transition layer 202 with a nonconductive metal oxide may decrease a gate dielectric's electrical thickness without significantly changing its physical thickness. Replacing silicon dioxide transition layer 202 with a conductive metal oxide may significantly decrease both the electrical and physical thickness of the gate dielectric. For that reason, embodiments of the present invention that replace a silicon dioxide layer with a conductive metal oxide may generate a high-k gate dielectric with an electrical thickness that is even thinner than the electrical thickness of a high-k gate dielectric stack, which results from replacing a silicon dioxide layer with a nonconductive metal oxide.

The method of the present invention enables a gate dielectric with a reduced electrical thickness. It does this by preventing a silicon dioxide transition layer from forming between a high-k gate dielectric layer and a silicon containing substrate, or by reducing a previously formed transition layer back to silicon. In effect, this method replaces an undesirable silicon dioxide transition layer with a metal oxide layer to reduce the overall electrical thickness of the gate dielectric stack—without increasing gate leakage.

Although the foregoing description has specified certain steps and materials that may be used in the method of the present invention, those skilled in the art will appreciate that many modifications and substitutions may be made. Accordingly, all such modifications, substitutions and additions fall within the spirit and scope of the invention as defined by the appended claims.

What is claimed is:

1. A method for making a semiconductor device comprising:
    forming a high-k gate dielectric layer that contacts a metal oxide layer, the high-k gate dielectric layer being formed on a silicon containing substrate;
    wherein the metal oxide layer is generated by forming a metal layer on the high-k dielectric layer, then oxidizing the metal layer, the metal layer being oxidized to generate the metal oxide layer after the metal layer is formed on the high-k dielectric layer; and
    wherein a layer of silicon dioxide that is positioned between the high-k gate dielectric layer and the silicon containing substrate is converted to silicon when the metal layer is oxidized to generate a conductive metal oxide layer.

2. A method for making a semiconductor device comprising:
    forming a high-k gate dielectric layer on a silicon containing substrate, a silicon dioxide layer forming between the high-k gate dielectric layer and the silicon containing substrate as the high-k gate dielectric layer is formed on the silicon containing substrate;
    forming a metal layer on the high-k gate dielectric layer; and
    oxidizing the metal layer to generate a metal oxide layer with the high-k dielectric layer between the metal oxide layer and the substrate, the silicon dioxide layer being converted to silicon as the metal layer is oxidized.

3. The method of claim 2 wherein the metal oxide layer is generated by subjecting the metal layer to an anneal process.

4. The method of claim 2 wherein the high-k gate dielectric layer is between about 5 angstroms and about 20 angstroms thick, and comprises a material that is selected from the group consisting of hafnium oxide, lanthanum oxide, zirconium oxide, and aluminum oxide.

5. The method of claim 2 further comprising forming a metal gate electrode on the metal oxide layer.

6. The method of claim 2 wherein the metal layer is between about 5 angstroms and about 10 angstroms thick, and comprises a material that is selected from the group consisting of titanium, zirconium, hafnium, tantalum, niobium, yttrium, ruthenium, and iridium.

7. The method of claim 6 wherein the metal oxide layer is a nonconductive metal oxide layer that comprises a material that is selected from the group consisting of titanium oxide, zirconium oxide, hafnium oxide, tantalum oxide, niobium oxide, and yttrium oxide, and the metal oxide layer forms part of a gate dielectric stack that includes the high-k gate dielectric layer.

8. A method for making a semiconductor device comprising:
    forming a high-k gate dielectric layer on a silicon containing substrate, a silicon dioxide layer forming between the high-k gate dielectric layer and the silicon containing substrate as the high-k gate dielectric layer is formed on the silicon containing substrate;
    forming a metal layer on the high-k gate dielectric layer, the metal layer being between about 5 angstroms and about 10 angstroms thick, and comprising a material that is selected from the group consisting of titanium, zirconium, hafnium, tantalum, niobium, yttrium, ruthenium, and iridium;
    oxidizing the metal layer to generate a conductive metal oxide layer that comprises a material that is selected from the group consisting of ruthenium oxide and iridium oxide, the silicon dioxide layer being converted to silicon as the metal layer is oxidized; and
    wherein the metal oxide layer forms part of a gate electrode stack for a metal gate electrode.

9. The method of claim 2 wherein the silicon dioxide layer is between about 5 angstroms and about 10 angstroms thick.

* * * * *